United States Patent [19]

Johnson

[11] Patent Number: 5,113,516
[45] Date of Patent: May 12, 1992

[54] DATA REPACKER HAVING CONTROLLED FEEDBACK SHIFTERS AND REGISTERS FOR CHANGING DATA FORMAT

[75] Inventor: Brian C. Johnson, Stamford, Conn.

[73] Assignee: North American Philips Corporation, New York, N.Y.

[21] Appl. No.: 388,281

[22] Filed: Jul. 31, 1989

[51] Int. Cl.⁵ .......................... G06F 3/00; G06F 5/01; H03M 7/00; H03M 7/30
[52] U.S. Cl. .................. 395/500; 364/259.6; 364/239.3; 364/260.6; 364/260.7; 364/951.1; 364/947.6; 364/965.7; 364/715.01; 341/60; 341/87
[58] Field of Search ... 364/200 MS File, 900 MS File, 364/715.01; 341/60, 87

[56] References Cited

U.S. PATENT DOCUMENTS

| | | | |
|---|---|---|---|
| 3,638,195 | 1/1972 | Brender et al. | 364/200 |
| 3,930,232 | 12/1975 | Wallach et al. | 364/200 |
| 4,131,940 | 12/1978 | Moyer | 364/200 |
| 4,141,005 | 2/1979 | Bonner et al. | 340/347 |
| 4,291,370 | 9/1981 | Charles | 364/200 |
| 4,430,711 | 2/1984 | Anderson et al. | 364/200 |
| 4,467,443 | 8/1984 | Shima | 364/900 |
| 4,506,345 | 3/1985 | Boothroyd et al. | 364/900 |
| 4,595,911 | 6/1986 | Kregness et al. | 364/347 |
| 4,667,305 | 5/1987 | Dill et al. | 364/900 |
| 4,845,668 | 7/1989 | Sano et al. | 365/49 |
| 4,885,584 | 12/1989 | Dalrymple | 341/101 |
| 4,963,867 | 10/1990 | Bertrand | 341/60 |

OTHER PUBLICATIONS

Terry A. Welch; "A Technique For High-Performance Data Compression"; Computer Jun. 1984. pp. 8-19.

Primary Examiner—Thomas C. Lee
Assistant Examiner—Krisna Lim
Attorney, Agent, or Firm—David R. Treacy

[57] ABSTRACT

A data repacker utilizing a multiplexer, one intermediate register, two shifters, and a control for these circuits. The multiplexer output is connected to the intermediate register, which has a storage length greater than the size of data words to be repacked. The first shifter receives the output of the register, and its output can be concatenated with an input data word to form one input to the multiplexer. The output of the register is provided as another input to the multiplexer. The second shifter also receives the output of the multiplexer, and has an output which is the repacker output. Information representing the number of bits in and the number of bits out is used to determine the most and least significant bits of the intermediate data which will be stored in the intermediate register, and to control the shifters.

12 Claims, 9 Drawing Sheets

DATA REPACKER HAVING CONTROLLED FEEDBACK SHIFTERS AND REGISTERS FOR CHANGING DATA FORMAT

CROSS-REFERENCE TO RELATED APPLICATIONS

The preferred embodiment disclosed herein embodies inventions claims in four other concurrently filed commonly-owned applications, by applicant herein and/or Imran A. Sha, namely Ser. Nos. 07/388,262; 07/388,279 now abandoned of which Ser. No. 07/750,220 filed Aug. 19, 1991 is a continuation; 07/388,282, now abandoned, of which Ser. No. 07/668,346 filed Mar. 11, 1991 is a continuation; and 07/388,283 now U.S. Pat. No. 5,058,137 issued on Oct. 15, 1991.

BACKGROUND OF THE INVENTION

The present invention relates to a data repacker for changing the format of a data signal.

It is often desirable to be able to change the format of data signals. Data is not always generated in standard widths such as eight or sixteen bits. Sometimes the data may be variable length coded data. Other data may have its own peculiar length, such as nine to twelve bit image data.

Repacking data to a desired format can be costly. If computing resources are used for the repacking, they may be tied up for an unacceptably long period of time. Moreover, the same data may have to be repacked more than once further increasing the costs associated with repacking.

SUMMARY OF THE INVENTION

An object of the invention is to provide an improved data repacker, which utilizes only a small amount of computer circuitry, and operates very quickly.

According to the invention, a data repacker requires only a multiplexer, an intermediate register, a shifter, and a control for these circuits. The multiplexer output is connected to the intermediate register, which has a storage length greater than the size of data words to be repacked. The shifter receives the output of the register, and its output can be concatenated with an input data word to form one input to the multiplexer. The output of the register is provided as another input to the multiplexer, which is selected by the multiplexer when the amount of valid (e.g., not yet read-out) data in the register does not leave room for concentration of another data word. This mode of operation is advantageous when used in a pipeline architecture.

To enable justification of the repacker output, preferably the output of the multiplexer is also provided to a second shifter. The second shifter has an output which is the repacker output.

The control circuit utilizes information representing the number of bits in and the number of bits out, to determine the most and least significant bits of the intermediate data which will be stored in the intermediate register, and to control the shifters.

In a preferred embodiment, the intermediate register and the shifters have a storage length twice the size of the data words, and the multiplexer is a 2:1 multiplexer.

DETAILED DESCRIPTION OF THE INVENTION

Figure 1:
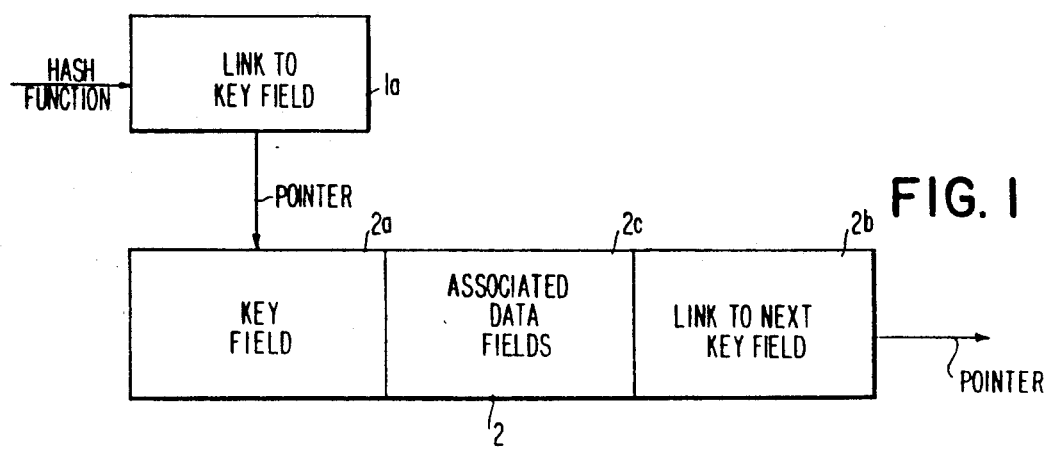
FIG. 1 illustrates the data organization used in the present invention.

The data organization or data structure used is illustrated in FIG. 1. A link field 1a is stored in memory independently of other data 2c at an address corresponding to a hash function value. Multiple link fields are stored in memory in a table at addresses corresponding to hash table values, and the value stored in the link field 2b at a hash table address is a pointer to the memory location or address of a corresponding key 2a and any other associated data fields 2c. Each key 2a is contained in a record 2 which also has an associated link field 2b for storing a pointer to a record of a successive key corresponding to the same hash address.

Figure 2:
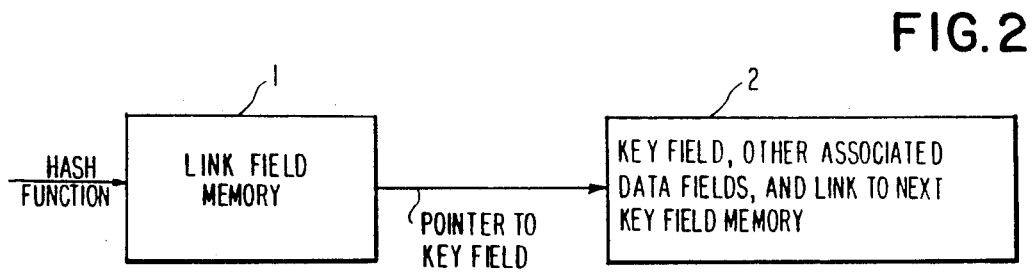
FIG. 2 illustrates the memory architecture according to the invention.

The corresponding memory architecture is shown in FIG. 2 and comprises a first memory 1 and a second memory 2. The first memory 1 stores only the link field values at the addresses comprising the hash table. Each address of the memory 1 is a hash table address and is addressed by a hash function value applied to the memory 1. In accordance with the invention, the capacity of memory 1 is chosen to optimize hashing according to a desired criteria. The load factor of the memory 1 used to store the hash table can be predetermined, and the capacity of memory 1 selected to achieve that load factor.

It is evident that the capacity of memory 1 and its load factor can be selected solely according to the size of the hash table, if desired. There is no need to consider the number of key fields or other data fields that will be stored, in order to select the capacity of memory 1. Memory 2 is used to store the key and other data fields.

Data stored in memory 2 can be inserted successively, and the address values at which the keys and other data are stored are the pointer values in the memory 1. The capacity of memory 2 is selected to be sufficient to meet the storage requirements for the keys and other data. The link fields in memory 2 permits chaining to be used for collision resolution. The first key corresponding to a particular hash address that is inserted in the memory 2 has an address in memory 2 corresponding to the pointer stored in memory 1 at the hash address. The second key corresponding to the same hash address is stored in memory 2 at an address of memory 2 which is stored in the link field of the record containing the first key. In this way, a linked list is created within memory 2 that is accessed through the pointer value stored in memory 1. The keys and other data successively stored in memory 2 can be stored in contiguous memory in the form of linked lists to maximize utilization of memory 2. The capacity of memory 2 need only be sufficient to meet the storage requirements of the data. Thus, the capacity of each memory can be independently optimized for hashing.

A consequence of the decoupling of the hash addresses and the associated key and other associated data fields is that a minimum of two memory accesses is required in order to retrieve a key. This doubling of retrieval time for a single key might be acceptable if retrieval of stored data is infrequent. However, if the stored data must be accessed repeatedly it would be desirable to effectively eliminate, or at least greatly reduce, the increased access time of the memory architecture just described.

Figure 3:
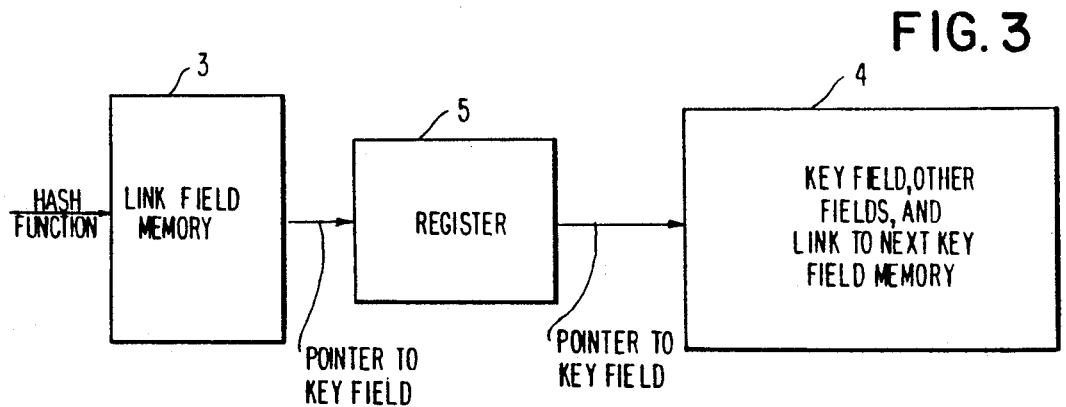
FIG. 3 illustrates another memory architecture according to the invention.

FIG. 3 illustrates another memory embodiment comprised of a first memory 3 for storing the link fields comprising the hash table. A second memory 4 stores key and other associated data fields, and link fields associated with each key, in the manner already described. Thus, both embodiments use the same method of data organization. This second embodiment further comprises a register 5 for storing the pointer values read out from the first memory 3, and for using the pointer values stored therein to access the second memory 4. The storage of the pointer value read out from the first memory 3 within the register 5 permits a second key to be hashed to the first memory 3 while the second memory 4 is being accessed.

For example, suppose a key $k_i$ is hashed to a particular address in the first memory 3 and a pointer stored at that address is read out. At the next read operation a subsequent key $k_{i-1}$ will be hashed to another address of the memory 3, while the pointer value in the register 5 will address the memory 4 to read out the data associated with $k_i$. The system can look for a match of key $k_i$ with the content of memory 4 while the key $k_{i-1}$ is being hashed to the first memory 3. If a match with key $k_i$ is attained the pointer associated with key $k_{i+1}$ can be applied to the second memory 4; otherwise, nothing is done with the pointer corresponding to key $k_{i+1}$ until key $k_i$ is resolved as either a success or failure. In either event, the access of the first memory 3 by the hashed value of key $k_{i+1}$ will have already occurred and will not contribute to the total search time.

Figure 4:
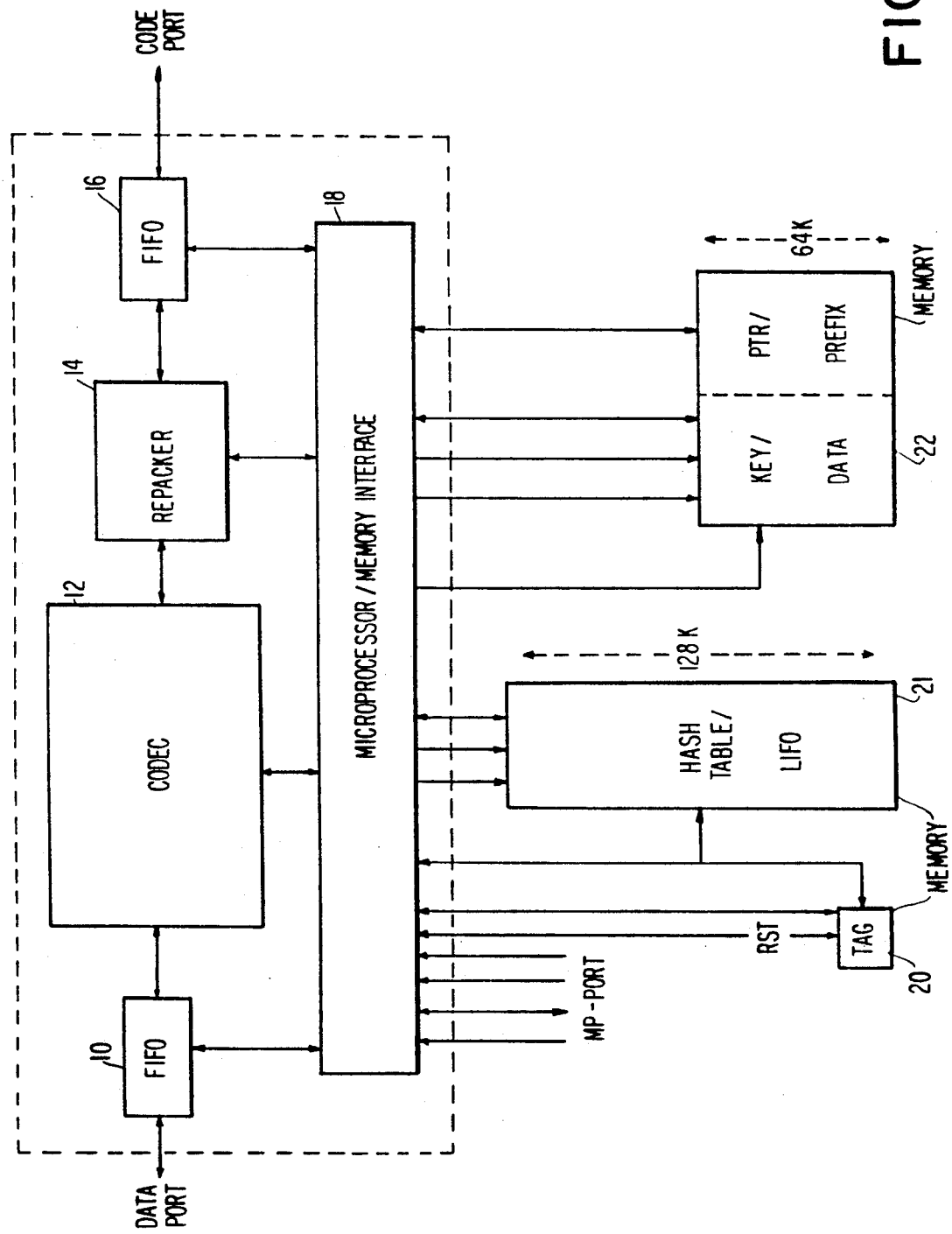
FIG. 4 illustrates a data compressor-decompressor having the memory architecture shown in FIG. 3.

One application for the disclosed data structure and memory architecture is in the area of data compression. FIG. 4 illustrates the structure of a dedicated integrated circuit for carrying out data compression according to the Lempel-Ziv algorithm, in which hashing is carried out by hardware circuits. The data which is hashed is organized and stored in a memory as just described.

A good introductory explanation of the Lempel-Ziv (LZ) algorithm can be found in the article by Terry A. Welch, "A Technique for High-Performance Data Compression", Computer, June 1984, pp 8–19. The treatment of the algorithm given in the Welch article is summarized below.

The LZ algorithm maps strings of input characters into fixed-length codes. The string-code word pairs are stored in a table called the string table. Table entries are generated during data compression. More particularly, a message comprised of a sequence of characters is parsed character-serially in one pass, and the longest recognized input string S is parsed off each time. A recognized string is one that already exists in the string table. The code word for the recognized string S is transmitted, and the recognized string S with the next character C of the message appended, SC, is added to the string table and assigned a unique code word.

The LZ algorithm can be more explicitly described as follows:

```
Initialize string table to contain single-character
    strings of message characters
Read first input character → prefix string S
STEP: Read next input character C
    If no such C (input exhausted): code S →
        output; EXIT
    If SC exists in string table: SC → S;
        repeat STEP
    Else SC not in string table: code (S) →
        output
            SC → string table
            C → S; repeat STEP
```

Starting with an initialized string table containing the character set from which the message will be composed, the first message character is read and set to the prefix string S. If there is a subsequent message character it is read and appended to the prefix string to form the new string SC. The string table is then checked to determine whether the string SC is already entered. If there already is an entry for SC, then the string SC is set to the prefix string S, the next message character C is read, and the step is repeated. Otherwise, if the string SC is not in the table, the output code word for the prefix string S is transmitted, a new table entry for the string SC is created, the character C is set to the prefix string S, and the step is repeated.

The data compressor/decompressor is comprised of a first-in first-out buffer memory (FIFO) 10 having an input which constitutes a data port which receives the sequence of message characters to be compressed. The FIFO 10 is not an essential element of the system but is used to smooth the data rate which could otherwise vary because of the variable search times that can occur during execution of the LZ algorithm.

A coder/decoder (CODEC) 12 receives the output from the FIFO 10 and encodes the applied signal according to the LZ algorithm by operating in the encoding mode. The encoded signals from the CODEC 12 are applied to repacker 14 which accepts input data streams of variable width and which generates output data streams of variable width. The repacker 14 output is applied to the FIFO 16 which is effective to smooth the rate of the code signals sent from the code port of the data compressor/decompressor.

The FIFO's 10 and 16, the CODEC 12, and the repacker 14 are initialized and put in operation by the microprocessor/memory interface 18. The interface 18 receives control signals from the system in which the data compressor/decompressor is incorporated, and passes signals between the components of the data compressor/decompressor just described and memories used by it. The FIFO's 10 and 16, CODEC 12, repacker 14 and interface 18 are, in the preferred embodiment, fabricated as a single integrated circuit, as shown by the dashed line in FIG. 4. The memories 20, 21 and 22, which are described below, are separate components. Alternatively, some or all of the components of the data compressor/decompressor could be constructed as separate units, or memory could be provided on the integrated circuit comprising the data compressor/decompressor.

The memory architecture requires that the Lempel-Ziv algorithm be executed somewhat differently than the basic LZ algorithm described above. This is because the first memory (21 in FIG. 4) contains only pointer values and thus can not be addressed without the string prefix, and the string prefix will not be available without accessing and resolving the search in the second memory (22 in FIG. 4).

In order to use the pipelined memory architecture the LZ algorithm is executed by assuming a prefix and then hashing the prefix-data combination. If the resulting pointer value is stored in the first memory 21 a success is assumed. Accordingly, a successive assumed prefix and new data are hashed to the first memory 21 while the key derived from the previous hashing operation addresses the second memory 22. If there is a match between the two keys one cycle of the processing of the next-prefix data will have been achieved. On the other hand, if the key does not match, i.e. there is a failure, the assumption about the prefix was incorrect. In the next cycle the key will be written in the second memory, and also during that cycle the new key with the corrected prefix will be hashed to the first memory. In this way the speed increase attributable to a pipeline architecture can be achieved with the LZ algorithm.

The justification of anticipating the prefix value is a consequence of the fact that the LZ algorithm compresses data such as an image by a factor of two to three, with average string lengths of between four and six data elements. This results in success about three times more frequently than failure when searching for a prefix-data combination. Consequently, one can anticipate a prefix and be correct 75% of the time, even before a prefix can actually be resolved.

In LZ encoding, data strings of varying length are represented by codes. Each successive data word is appended to a prefix, which is a code representing a string of previous data words. A search is then performed in the code-table for this prefix-data combination, representing a longer string. If the prefix-data combination is found in the code table ("a success") the code assigned to this prefix-data combination becomes the new prefix. The next data word will then be appended to this new prefix when the cycle is repeated. If the prefix-data combination is not found in the code table, it is added to the table along with a new code-word representing it. The prefix, representing the longest found data string found in the table, is transmitted.

The CODEC 12 includes circuitry for both encoding input data according to the LZ algorithm, and for decoding LZ-encoded data.

Figure 5:
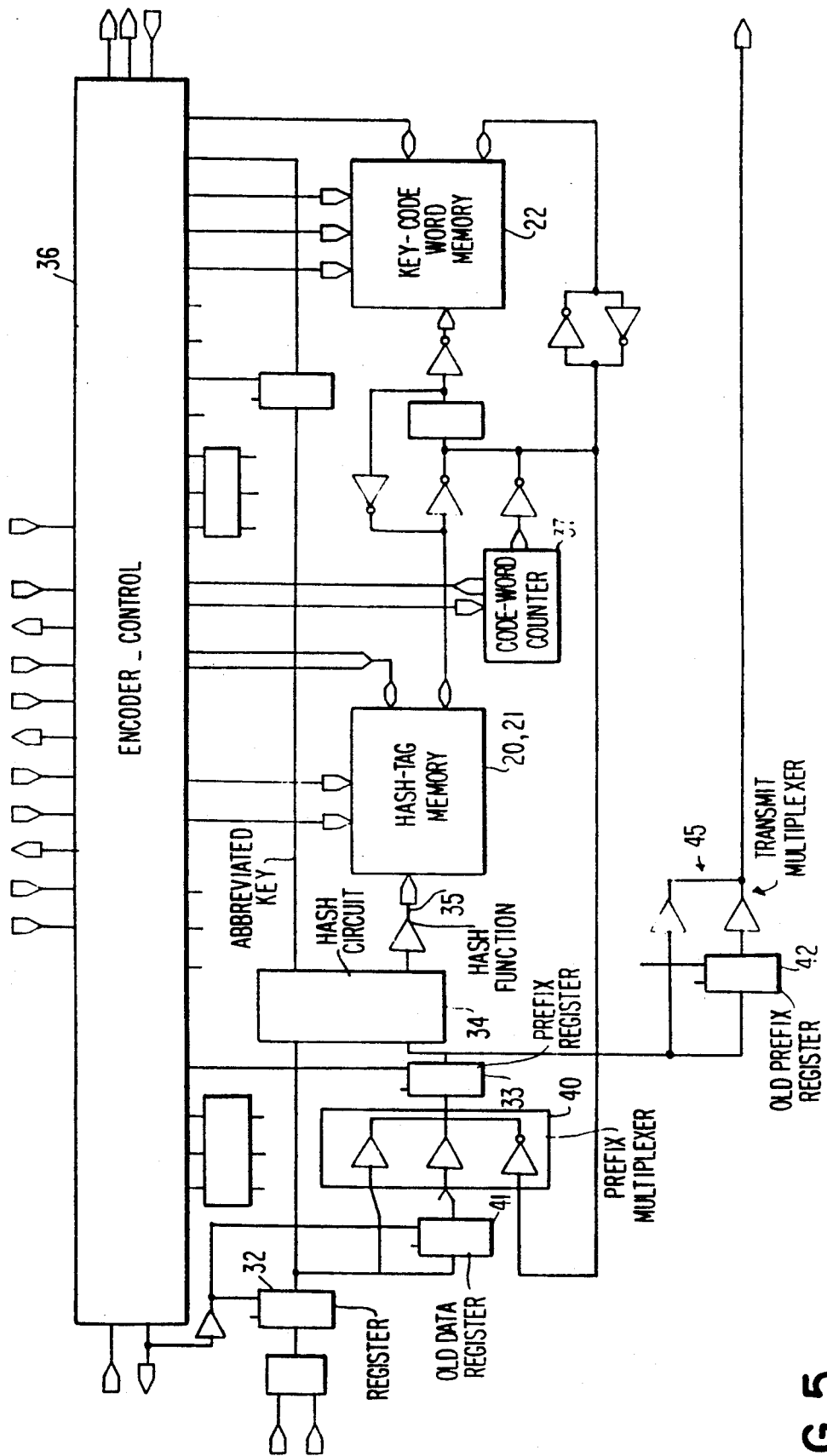
FIG. 5 illustrates a data encoder used in the compressor-decompressor shown in FIG. 4.

The encoder portion of the CODEC 12 is illustrated in FIG. 5. A new data word is received from the FIFO 10 by the data register 32. A prefix register 33 stores a prefix to which the new data word is to be appended. The new data word and the prefix from the register 33 are applied to a hash circuit 34 which develops a hash address and an abbreviated key. The hash circuit 34 is described in detail, below.

The hash address is applied through the signal path 35 to the hash-tag memory 20, 21 to read out the content of the memory 20, 21 at the address corresponding to the hash function. The tag value read out from the hash-tag memory is either 0 or 1 depending upon certain conditions. The memory 21 reads out a pointer to the possible location of the key in the second memory. (Although hash-tag memory 20, 21 is shown in FIG. 5 as part of the encoder, it is physically separate from the encoder as shown in FIG. 4).

A tag bit value of 0 indicates that the prefix-data combination has not been encountered before (a "failure"). In this case a new code word corresponding to the hash address is obtained from the code-word-counter 37 and entered at the memory location of the hash memory 21 through the encoder control 36. The tag bit is re-written as a 1 to indicate a valid entry at the memory location. Finally, the abbreviated key is entered at the code-word location of the key-code-word memory 22. The prefix-multiplexer 40 selects the current data from the register 32 as the next prefix and stores it the prefix-register 33. The current prefix content of the register 33 is transmitted out through the transmit multiplexer 45 to the repacker 14.

A tag bit value 1 indicates a valid entry in the hash memory 21. In this case, the content of the hash memory will be used in the next cycle as an address to read and compare the abbreviated key. At the same time the prefix multiplexer 40 will assume that the abbreviated key will match and will use the contents of the hash memory 21 as the next prefix. If the abbreviated key matches, i.e., a success, the prefix assumption was valid. The operation of the encoder continues using the results of the access to the hash-memory.

If the abbreviated key does not match and the tag bit of the key-code word memory 22 is 0, which indicates an end of list, then the condition is a failure following a collision. The assumption made about the prefix in order to carry out the hash operation was incorrect. The results of the hash operation are then ignored and the old data stored in the old data register 41 is used as the new and correct prefix. At the same time the old prefix stored in the register 42 is transmitted out. The tag bit value of the key/code-word memory is updated to 1, and the code word value is written in the code-word memory 22. In the next cycle, using the code word memory contents as the address, the new abbreviated key is written in the key memory 22 and the tag bit at that location is initialized to 0. In other words, a new link is added to the link list, and the end-of-list pointer is updated.

When the abbreviated key does not match, but the tag bit of the key/code-word memory is 1, the end of the list has not yet been reached. The content of the code-word memory 22 at this address is pointing to the next possible location of the key being sought.

In the next cycle the content of the code-word memory is used as an address and the key is searched for again. This process is continued until either the key is found, a success occurs, the end-of-list is reached, or a failure occurs. Each time an address is found pointing to the next possible location of the key, it is assumed that the key is going to be found there. Because a success is assumed, this address is used as the prefix for hashing and is passed through the prefix multiplexer 40 to the hash circuit 34. The results of a hashing are used only if the key matches, i.e. a success occurs.

Information regarding the data to code word correspondence developed by the encoder during the encoding process is used by the decoder during subsequent decoding. During encoding a transmission is made after every failure, and is accompanied by a new code-table entry. This information is used by the decoder. Each time the decoder receives a code it makes a corresponding entry to its code-table by appending the first character of the currently received code to the previous code and assigning a new code word to it in the code table. At the same time the decoder outputs a string corresponding to the current code, always operating just a step behind the encoder.

Figure 6:
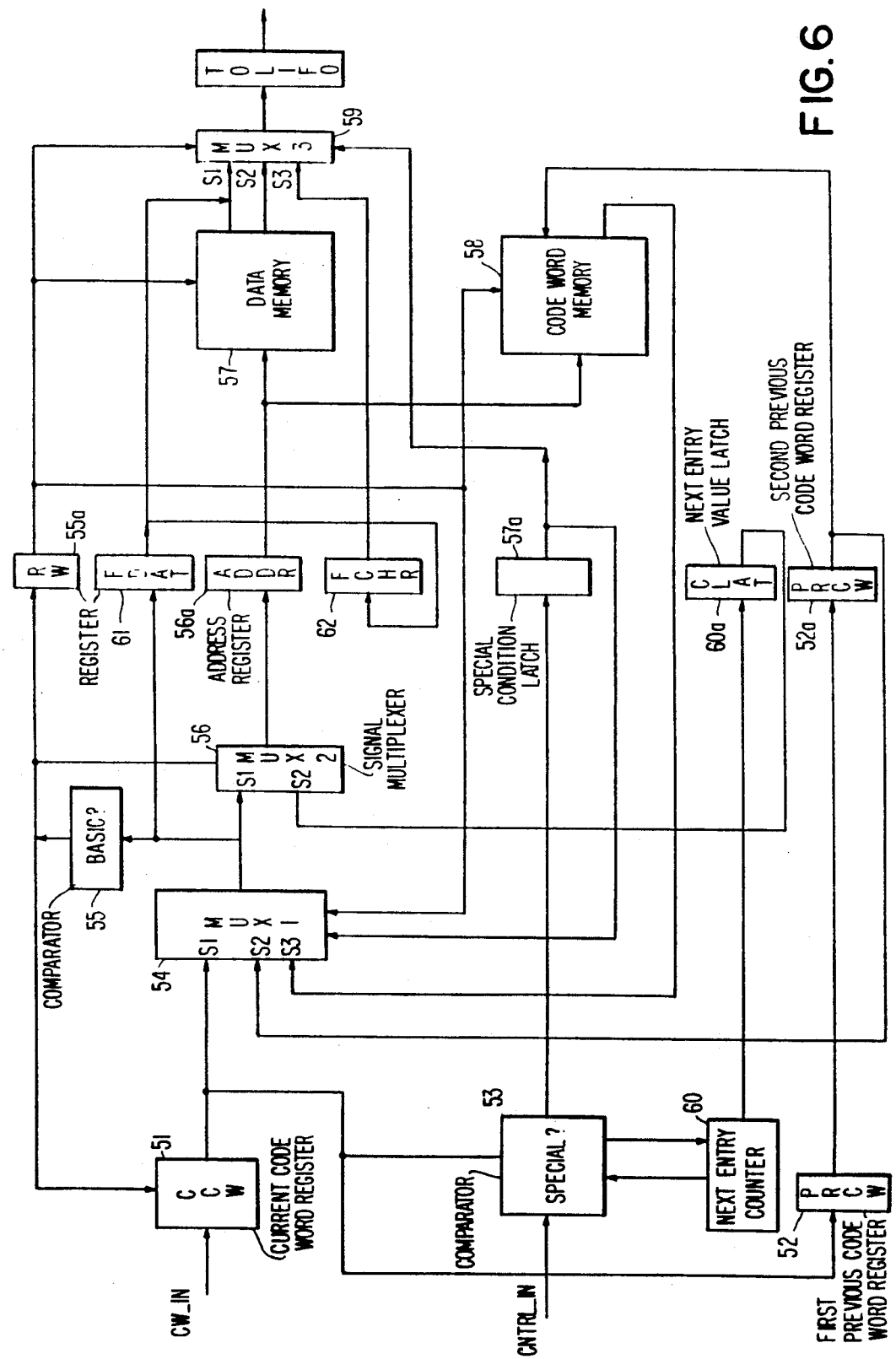
FIG. 6 illustrates a decoder used in the compressor-decompressor shown in FIG. 4.

The decoder circuit of the CODEC 12 is shown in FIG. 6. Current code word register 51 receives a code word from the repacker 14. The register 51 receives a code word after a previous code word has been decoded so that the code word stored in the register 51 is the current code word to be decoded. The code word stored in the register 51 is also stored in the register 52 for use as the previous code word after the register 51 receives a new code word. Finally, the current code word is tested by the circuit 53 to determine whether it is "Special" as described later.

The multiplexer 54 applies the current code word to the comparator 55 which checks whether the code word belongs to the "Basic" set or is a "Special" case. If the code word is not Basic and not Special the multiplexer 56 passes it to address register 56a to be used as an address for retrieving the data-code word entry at that address in the data memory 57 and code word memory 58. The data at that address is transmitted through the multiplexer 59 to the LIFO control logic 138. Similarly, the code word retrieved from that address is used again, and is transmitted through multiplexer 54 to the comparator 55 to determine whether it is Basic. This sequence of steps is repeated until the code word retrieved from the code word memory 58 is Basic.

If the code word is determined to be Basic, the end-of-string condition has been reached. The end-of-string condition occurs when the decoder has completed unraveling the string represented by the current code word. The register 55a provides a one-clock-pulse delay in the control signals consistent with the pipeline operation of the decoder. At this time the decoder is ready to make a new entry in the decoder table at the memory address pointed to by the next-entry counter 60 through the next entry value latch 60a and the multiplexer 56. The decoder is also ready to accept a new code word from the current-code-word register 51. In the next cycle of operation the Basic code word is output from the register 61 through the multiplexer 59. At the same time a new entry comprising the previously received code word stored in the register 52, and the first character of the current code word, stored in register 61, is written into the code word memory 58 and data memory 57, respectively. A new code word is also taken from the current code word register 51 at this time.

A code word is considered Special if it is also the next entry to be made in the decoder table. The new code word is compared by the Special comparator 53 with the count value of the next entry counter 60. If the new code word and the next entry counter value match the code word is Special. The Special condition latch 53a provides a clock delay required by the pipelining of the decoder. Because no entry corresponding to this code word has been made in the decoder tables, the data memory 57 and the code word memory 58 will not be accessed in the following cycle of operation. Instead, the first character of the previous code word, stored in the register 62 is transmitted to the LIFO 10 through the multiplexer 59. To continue the decoding the previously received code word from the register 52 is passed through the second previous code word register 52a which functions as a pipeline delay latch, to the multiplexer 54 and used as the address to access the data memory 57 and the code word memory 58.

The scheme for generating the hash function is implemented by a special purpose circuit. Before describing the hash function generating circuit the mathematical functions governing the hash function will be considered.

The design of hash function generators has received considerable attention. The hash function generator must efficiently generate the hash function from the key, and it must perform a pseudo-randomizing function so that all of the keys are not mapped into the same hash address.

For example, a small five-character ASCII field would require $(128)^5$ or over one trillion memory address, if it were to be stored in unique addresses corresponding to its value. The first character of the five character field might be taken as a simple hash function thereby reducing the address field of the hash function to only 128 locations. To retrieve a data item of interest one would address the memory location corresponding to the value of the first character of the key, and then look for the entry with the key that matches all five characters. Obviously, if every key started with the same character, then the desired key and data could be retrieved only by searching the entire address space of the keys.

It should also be noted that in the given example, all keys corresponding to a particular hash function have the same first character. Thus, in such a case the first character of the keys need not be stored, and an abbreviated key can be used instead. In this example the abbreviated key would be the last four letters of the word. Accordingly, it would be desirable to use a hash function generator that is efficient, is pseudo-randomizing and which permits the use of abbreviated keys. This last property imposes the requirement that the hash function and the abbreviated key uniquely represent the input key.

According to the method that is employed, the key k, hash function h and abbreviated key a, are represented in binary form as vectors. The hash function generator H and abbreviated key generator A are matrices of 1's and 0's which satisfy the following equations.

$$h = Hk. \quad (1)$$

$$a = Ak. \quad (2)$$

Equations (1) and (2) can be combined in the following manner $\begin{bmatrix} h \\ a \end{bmatrix} = \begin{bmatrix} H \\ A \end{bmatrix} = k. \quad (3)$ where $\begin{bmatrix} h \\ a \end{bmatrix}$ is a vector, and $\begin{bmatrix} H \\ A \end{bmatrix}$ is a matrix.

If the matrix $\begin{bmatrix} H \\ A \end{bmatrix}$ is invertible, then the following relation holds $k = \begin{bmatrix} H \\ A \end{bmatrix}^{-1} \begin{bmatrix} h \\ a \end{bmatrix}. \quad (4)$ Consequently, the combination of the hash function h and the abbreviated key a uniquely represent the original key k. This is an important feature. The uniqueness of the combination of the hash function and the abbreviated key allows for the storage of just the abbreviated key in the second memory with an attendant reduction in memory requirements, and without the loss of the ability to resolve collisions.

The form of the hash function generator H, and the operations required to compute equation (1), are particularly well suited to hardware implementation. This can be seen by expanding equation (1) to show the individual elements of the matrix H and vector k as follows:

$$h = \begin{bmatrix} h11 & h12 & \ldots & h1n \\ h21 & & & \\ \vdots & & & \vdots \\ hm1 & hm2 & & hmn \end{bmatrix} \begin{bmatrix} k1 \\ \vdots \\ \vdots \\ kn \end{bmatrix} \quad (5)$$

The hash function generator H is an m x n matrix, where $h_{ij}=0$ or 1. The key k is a column vector of n bits, and $k_j=0$ or 1. Carrying out the matrix multiplication yields:

$$h = \begin{bmatrix} h11\,k1 & + & h12\,k2 & + & \ldots & + & h1n\,kn \\ & & & & & & \\ h21\,k1 & & & & & & \\ \vdots & & & & & & \\ hm1\,k1 & + & hm2\,k2 & + & \ldots & - & hmn\,kn \end{bmatrix} \quad (6)$$

which is an m × 1 column vector. Each element of the hash function h is calculated as the sum $$h_i = \Sigma h_{ij} k_j, j = 1 \ldots n \quad (7).$$

where multiplications are binary multiplications, or logical AND, and the summation is binary addition without carry, or modulo-two addition. Thus, the products $h_{ij} k_j = 1$ or 0 depending upon whether $h_{ij}$ is 1 or 0, and signals corresponding to the products $h_{ij} k_j$ can be obtained by simply transmitting or not transmitting the bit $k_j$ depending upon whether $h_{ij}$ is 1 1 or zero. The ith bit, $h_i$, of the hash function h is then equal to the modulo-two sum of the transmitted $k_j$ values for that particular value of i.

For example, assume the following hash function generator:

$$H = \begin{bmatrix} 1 & 0 & 1 & 0 & 0 & 1 \\ 0 & 1 & 1 & 0 & 1 & 0 \\ 1 & 0 & 0 & 0 & 1 & 1 \end{bmatrix}$$

which is a (3×6) matrix for generating a three-bit hash function from a six-bit key.

Figure 7:
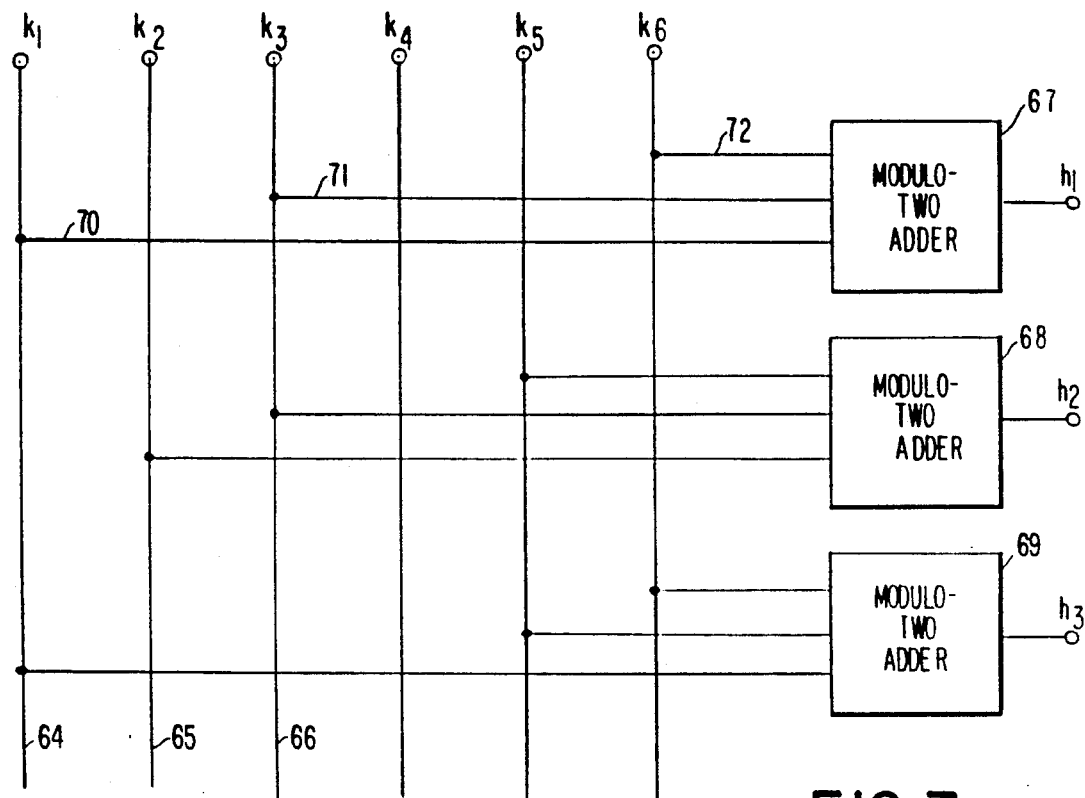
FIG. 7 is a schematic of the hash circuit shown in FIG. 4.

A hashing circuit which implements this generator and carries out hashing using it is shown in FIG. 7. The hashing circuit is comprised of n signal lines each corresponding to a column of the hash function generator H. The key k is represented by binary signals k1 through k6, and each is applied to a corresponding one of the signal lines 64, 65, 66 etc. The modulo-two adders 67, 68 and 69 with their input connections each correspond to a row of the hash function generator H, and each develops a binary output signal corresponding to one of the three bits of the hash function h.

The connections between the signal lines 64 etc. and the inputs of the modulo-two adders 67-69 correspond to the non-zero elements of the hash function generator H. For example, modulo-two adder 67 corresponds to the first row of the matrix H, which has 1 in the first, third and sixth columns. Signal line 70 connects the signal line for $k_1$ to the modulo-two adder 67, and similarly signal line 71 connects the signal line for $k_3$ and signal line 72 connects the signal line for $k_6$ to it. The output of adder 67 is then $(k_1+k_3+k_6) \pmod 2 = h_1$.

Similarly, the modulo-two adders 68 and 69 develop binary output signals corresponding to the bits $h_2$ and $h_3$ of the hash function h. In the case where an abbreviated key is to be generated, additional modulo-two adders are provided for the respective bits of the abbreviated key.

Figure 8:
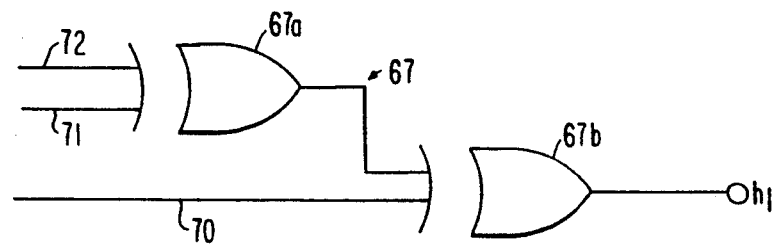
FIG. 8 is a schematic of one of the modulo-two adders shown in FIG. 7.

The modulo-two adders can be constructed by connecting Exclusive-OR gates 67a and 67b in the manner shown in FIG. 8. This circuit is also known as a parity checker and can be readily expanded by adding more Exclusive-OR gates in order to accommodate more than three inputs.

An advantage of the disclosed hashing circuit is that hashing can be carried out at the system clock speed. Unlike other hashing techniques which use other types of hash function generators, the matrix multiplication of equation (1) is carried out in a single step with the simultaneous occurrence of the multiplications and additions comprising the matrix multiplication. Thus, the circuit can be readily used for carrying out hashing in real time.

Figure 9:
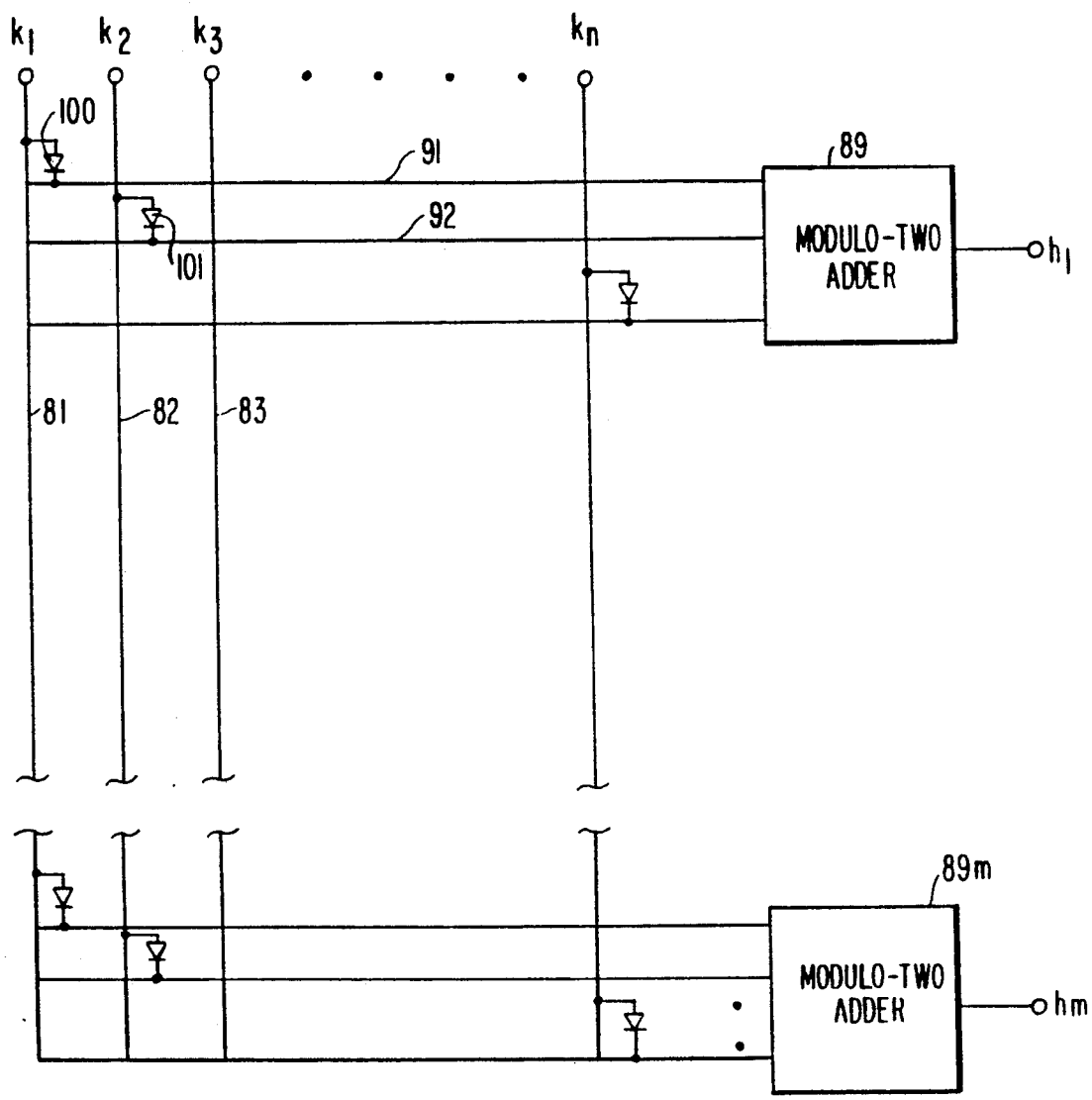
FIGS. 9 and 10 are schematics of other embodiments of hash circuits.

Another advantage of the hashing circuit is that it can be made programmable, and a particular hash function generator H can be selected after the circuit has been fabricated. A programmable embodiment of the hashing circuit is shown in FIG. 9. This circuit comprises n input signal lines 81, 82, 83, etc. each for receiving a corresponding one of the binary signals $k_1$ through $k_n$ corresponding to the bits of the key. There are m modulo-two counters, the first and last of which are labeled 89 and 89M. The output of each modulo-two counter is a binary signal corresponding to one bit of the hash function h.

Each modulo-two counter has n inputs, and n circuit paths 91, 92, etc. are connected to the respective inputs. The signal lines 81, 82, . . . and the circuit paths 91, 92, . . . cross in an array to permit interconnections between the two. The interconnections between the signal lines and the circuit paths are made by diodes 100, 101, etc. Each diode is connected between a respective one of the signal lines and a respective one of the circuit paths. For example; diode 100 connects signal path 81 and circuit path 91; diode 101 connects signal path 82 and circuit path 92, etc. The diodes are fusible in order to open the connection which they establish. Upon the application of a sufficiently high voltage to a selected one of the diodes, the selected diode fails and an open circuit exists between the signal line and the circuit path between which it was connected. The use of fusible diodes to open predefined circuit links and thereby render a circuit programmable is known from programmable logic device technology and can be done in the manner known in that technology.

For simplicity, not all of the signal lines, circuit paths or diodes are shown. As the programmable hash circuit has been described, however, there are n circuit paths for each of the m modulo-two adders, and a diode for connecting each of the signal lines to a corresponding circuit path. This structure is programmable to realize any m-bit hash function, but the modulo-two adders are consequently of the maximum size.

Figure 10:
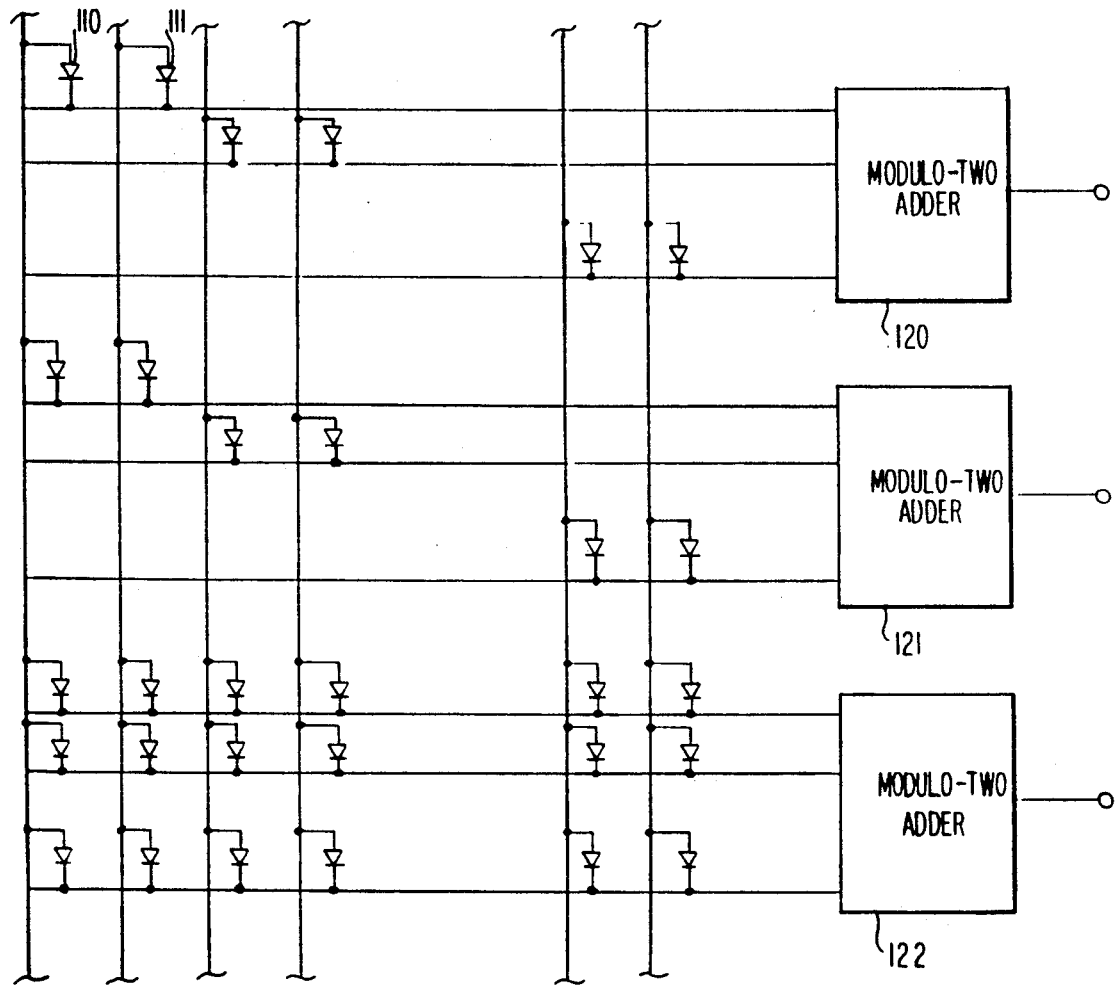

In another embodiment of the invention the modulo-two adders have fewer inputs than the number of signal lines. and at some of the circuit paths is connected to more than one signal line. Such an embodiment is shown in FIG. 10 in which the modulo-two adders 120, 121 and 122 have fewer than n inputs. In this particular embodiment, the modulo-two adders 120 and 121 have an equal number of inputs and the modulo-two adder 122 has a fewer number of inputs. Different schemes for allocating diode connections between the signal lines and the circuit paths can be used. The modulo-two adders 120 and 121 have a sufficient number of diodes 110, 111 etc. so that each signal line is connected to at least one circuit path. In contrast, every signal line is connected to every circuit path for the modulo-two adder 122 so as to achieve the maximum degree of programmability.

The matrix which is a composite of the hash function generator H and the abbreviated key generator A can be derived in a straightforward manner. Starting with the identity matrix pairs of bit rows or columns can be selected at random, added modulo-two, and the sum substituted for the first selected row or column, or simply exchanged. These linear operations applied to an invertible matrix preserves the invertibility property. Consequently, it provides a way to generate a randomized invertible matrix. These steps must be repeated any number of times, and the first m rows of the resulting matrix is H and the remaining (n-m) rows is A.

Figure 11:
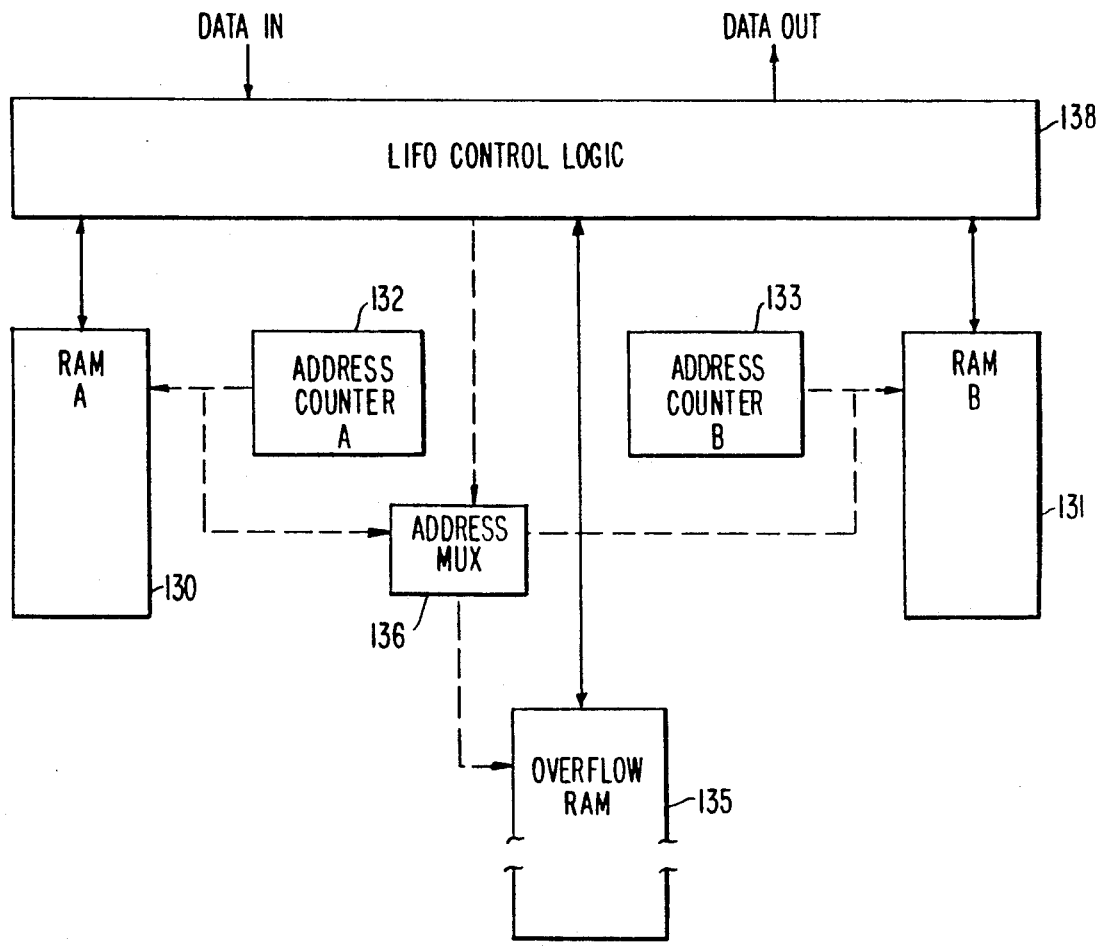
FIG. 11 illustrates a last-in first-out buffer comprising part of the control of the encoder shown in FIG. 5.

To reverse the order of characters in the string sequence as the LZ decoding algorithm requires, the data decoder applies its output to a last-in first-out buffer (LIFO), which is illustrated in FIG. 11. The LIFO is comprised of two random access memories (RAM) 130 and 131, controlled by LIFO control logic 138, through which input data from CODEC 12 and output data pass. A first character string is read into the memory 130. The character order is preserved by the address counter 132 which develops a sequence of address values for storing the characters of the input string in sequence.

Diminishment of the system performance by LIFO operation is avoided by the provision of a second RAM 131 which can also be addressed during addressing of the RAM 130. Character strings are stored in order in the RAM 131 under control of its corresponding address counter 133.

To prevent loss of data an overflow memory 135 is provided to receive and store data when the respective RAM 130 or 131 being written into is full. For example, if an input string is written into RAM 130 and its capacity is reached, the input string is then written into the overflow memory 135. The order of the string is preserved by using the address counter 132 for both the RAM 130 and the overflow RAM 135. When the RAM 130 becomes full additional data is passed to the overflow RAM 135 and the address counter 132 continues the sequential count of address values associated with the string being read in. The address values are applied through the address multiplexer 136 so that correspondence between the string characters and the count value is preserved even though the string is stored in two physically separate memories.

When the string data is read out the address counter 132 counts backward from the last memory value address during the writing of the string into the overflow RAM 135. In this way the stored string is read out in reverse order.

During the reading out of the string stored in the overflow RAM 135 and RAM 130, another string is written into the RAM 131 and stored at successive memory locations having addresses determined by the address counter 133. The feature of separate means for developing address values for the respective memories 130, 131 enables them to be operated separately so that one can write in data while data is read out from the other. In this way equal length strings can be reversed without slowing the processing speed of the system in which the LIFO buffer is used.

From the described mode of operation it is clear that for RAMS 130 and 131 having at least a depth D, the LIFO buffer can continuously buffer strings of length 2D without any loss of speed. This result follows from the fact that a stored string of length 2D filling one RAM, for example RAM 130, and the overflow RAM 135 is read out first from the overflow RAM 135 in order to reverse the string. During this reading out the simultaneous writing and storage of a subsequent string will start with the RAM 131. The RAM 131 of depth D will not be completely filled until the overflow RAM 135, which stored a string segment of length D, is empty thus freeing the overflow RAM 135 to store the remaining segment of length D of the string being written.

In order to handle strings of length greater than 2D the overflow RAM 135 must have a depth greater than D. Strings longer than 2D will degrade the performance of the LIFO buffer. The degree of performance degradation is equal to the sum of the long string length and the short string length divided by twice the long string length. In the worst case the LIFO buffer speed approaches one-half the maximum speed.

Figure 12:
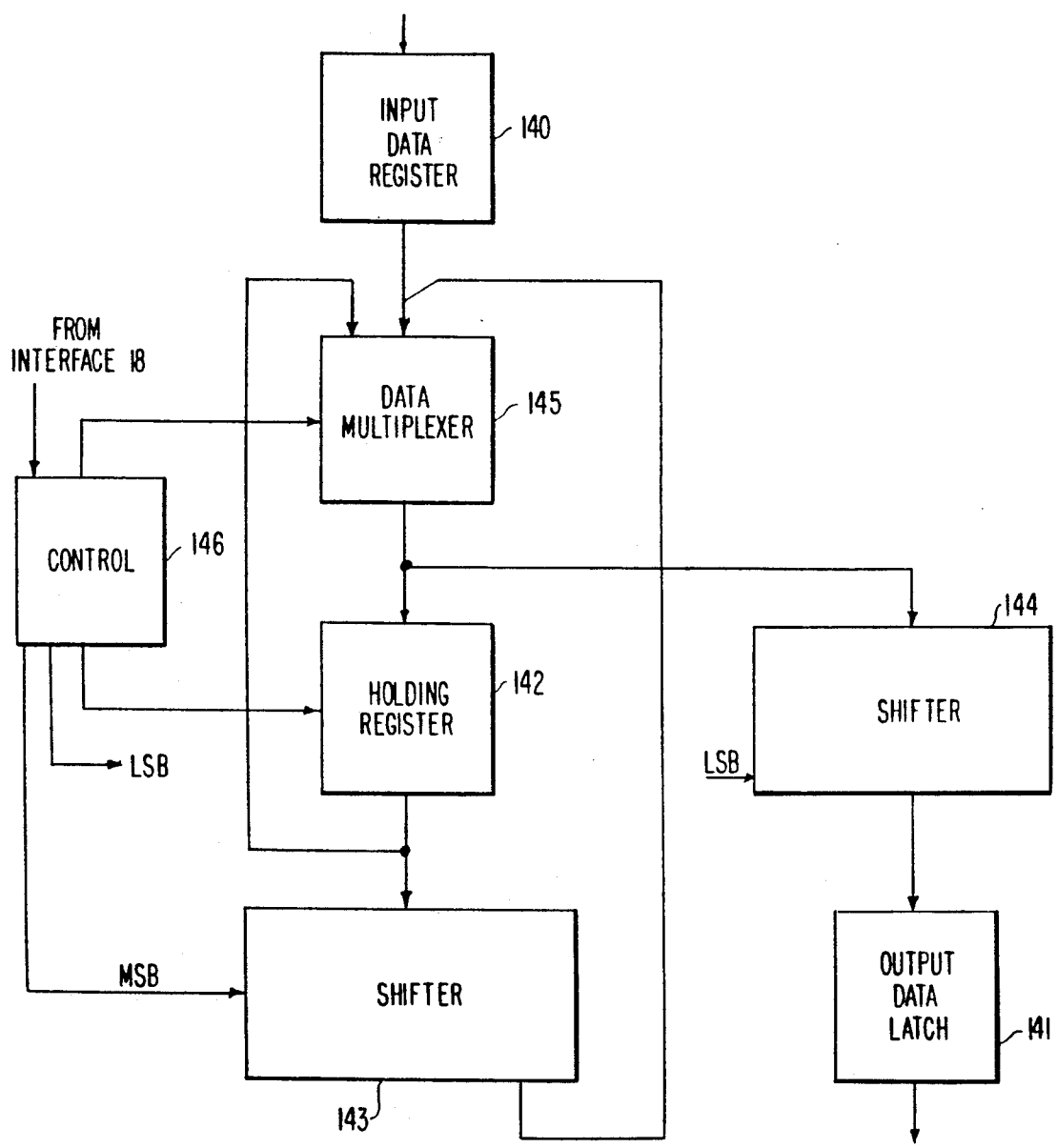
FIG. 12 is a block diagram of a data repacker 14 shown in FIG. 4 in accordance with the invention.

The data repacker 14 circuit is shown in FIG. 12. It is comprised of an input data register 140 and an output data latch 141, both of which help improve system performance. Neither the register 140 or the latch 141 are used in the actual data repacking function, however.

The holding register 142 is used to store intermediate results and has a storage length twice the size of the data words being repacked. Shifter 143 and shifter 144 also have a storage length twice the size of the data words and select a number of bits equal to the data word length, e.g. sixteen of thirty two bits. The multiplexer 145 is a 2:1 multiplexer. One input of the multiplexer 145 is connected to the output of the holding register 142, to maintain the contents of register 142 until the amount of valid data remaining leaves room for concentration of new data latched in register 140. When directed by the control circuit 146, the other input receives concatenated input data and data from shifter 143.

In operation, the control circuit 146 receives signals from the microprocessor/memory interface 18 which represent the number of bits in (NBI) and the number of bits out (NBO). From this information it determines a most significant bit (MSB) and a least significant bit (LSB) of the intermediate data which will be stored in the holding register 142.

When data is passed to the input of the repacker it is latched by the input data register 140, and on the next clock cycle it is combined with the intermediate data in the holding register 142, if there is room. There will be room is there are fewer valid intermediate data bits in the holding register 142 than the number of bits in a data word. The number of valid data bits equals MSB minus LSB. If there is sufficient room the input data becomes the high bits of the holding register, and the shifted data from the holding register becomes the low bits of the holding register. If there is insufficient room in the holding register 142 the input data is not combined with the intermediate data. The shifter 144 receives a signal indicating the LSB and shifts its content to right-justify the intermediate data for presentation at the output.

What is claimed is:

1. A data repacker, comprising:
    an intermediate register for holding intermediate results;
    a data multiplexer having two inputs and an output connected to said register;
    a circuit path for providing the output of said register to one of said inputs;
    means for providing input data to the other of said inputs;
    a first shifter for shifting the output of said register and having an output connected to said other of said inputs, for concatenation with said input data;
    means, utilizing the output of said data multiplexer, for providing an output of the data repacker, and
    control means for controlling said data multiplexer, intermediate register and first shifter, to maintain the contents of said intermediate register until an amount of valid data remaining in the intermediate register leaves room for concatenation of new data with the output of said first shifter.

2. A data repacker as claimed in claim 1, wherein said means for utilizing comprises a second shifter for shifting the output of said data multiplexer, said second shifter having an output constituting the output of the data repacker.

3. A data repacker as claimed in claim 2, wherein said intermediate register has a storage length twice the size of data words to be repacked, and said multiplexer is a 2:1 multiplexer.

4. A data repacker as claimed in claim 3, wherein said first and second shifter each have a storage length twice the size of data words to be repacked.

5. A data repacker as claimed in claim 2, wherein said control means concatenates the output of the first shifter and an input word such that the input data becomes the high bits of the register, and the shifted data becomes the low bits in the register.

6. A data register as claimed in claim 5, wherein, responsive to receipt of data indicating the least significant bit, said control means shifts the content of the second shifter to right-justify the data received from the multiplexer.

7. A data repacker as claimed in claim 5, wherein said intermediate register has a storage length twice the size of data words to be repacked, and said multiplexer is a 2:1 multiplexer.

8. A data repacker as claimed in claim 7, wherein said first and second shifters each have a storage length twice the size of data words to be repacked.

9. A data repacker as claimed in claim 1, wherein said control means concatenates the output of the first shifter and an input word such that the input data becomes the high bits of the register, and the shifted data becomes the low bits in the register.

10. A data repacker as claimed in claim 1, wherein said means for providing input data further comprises a latching input data register, and
    said means for utilizing comprises an output data latch.

11. A data repacker as claimed in claim 1, wherein said means for providing input data further comprises a latching input data register.

12. A data repacker as claimed in claim 1, wherein said means for utilizing comprises an output data latch, and
    a second shifter for shifting the output of said data multiplexer, said second shifter having an output provided to said output data latch.

* * * * *